United States Patent
Faison

(10) Patent No.: US 8,154,350 B2
(45) Date of Patent: Apr. 10, 2012

(54) PLL WITH CONTINUOUS AND BANG-BANG FEEDBACK CONTROLS

(75) Inventor: Kevin G. Faison, Owings Mills, MD (US)

(73) Assignee: Texas Instruments Incorporated, Dallas, TX (US)

( * ) Notice: Subject to any disclaimer, the term of this patent is extended or adjusted under 35 U.S.C. 154(b) by 125 days.

(21) Appl. No.: 12/726,190

(22) Filed: Mar. 17, 2010

(65) Prior Publication Data

US 2011/0227615 A1 Sep. 22, 2011

(51) Int. Cl.
*H03L 7/00* (2006.01)

(52) U.S. Cl. ............ 331/16; 331/34; 331/175; 331/167; 331/117 R; 331/177 V; 331/117 FE; 327/157

(58) Field of Classification Search .................... 331/16, 331/34, 177 V, 167, 175, 117 R, 117 FE; 327/157
See application file for complete search history.

(56) References Cited

U.S. PATENT DOCUMENTS

| | | |
|---|---|---|
| 6,658,748 B1 | 12/2003 | Leipold et al. |
| 6,952,124 B2 | 10/2005 | Pham |
| 7,010,285 B2 | 3/2006 | Dhuna |
| 7,015,763 B1 | 3/2006 | Hallivuori et al. |
| 7,133,485 B1 | 11/2006 | Baird et al. |
| 7,138,839 B2 | 11/2006 | Zachan et al. |
| 7,263,152 B2 * | 8/2007 | Miller et al. .................. 375/371 |
| 7,301,407 B2 | 11/2007 | Cho |
| 7,385,452 B2 | 6/2008 | Harjani et al. |
| 2002/0008593 A1 | 1/2002 | Gomez et al. |
| 2003/0141936 A1 | 7/2003 | Staszewski et al. |
| 2005/0212609 A1 | 9/2005 | Jasa et al. |
| 2005/0212614 A1 | 9/2005 | Peluso |
| 2007/0057736 A1 | 3/2007 | Baird et al. |

OTHER PUBLICATIONS

"A 4.2 GHz PLL Frequency Synthesizer with an Adaptively Tuned Coarse Loop," IEEE 2007 Custom Intergrated Circuits Conference (CICC), pp. 547-550 (Ting Wu, Pavan Kumar Hanumolu, Kartikeya Mayaram, and Un-Ku Moon).
"Modeling, Design and Characterization of a New Low-Jitter Analog Dual Tuning LC-VCO PLL Architecture," IEEE Journal of Solid State Circuits, vol. 40, No. 6, Jun. 2005, pp. 1303-1309 (Roberto Nonis, Nicola Da Dalt, Pierpaolo Palestri, and Luca Selmi).

(Continued)

*Primary Examiner* — Arnold Kinkead
(74) *Attorney, Agent, or Firm* — John J. Patti; Wade J. Brady, III; Frederick J. Telecky, Jr.

(57) ABSTRACT

An apparatus is provided. The apparatus comprising a voltage controlled oscillator (VCO), an amplifier, a switch, a calibration capacitor, and a control loop. The VCO includes a capacitive network that receives a first tuning voltage that is based at least in part on an input signal and a switched capacitor array that is coupled to the capacitive network. The amplifier amplifies the difference between the reference voltage and the first tuning voltage. The switch receives the reference voltage and the amplified difference between the reference voltage and the first tuning voltage. The calibration capacitor receives the output from the switch and generates a second tuning voltage. The control loop receives the input signal and the second tuning voltage. The control loop also controls the switch so as to apply the reference voltage to the calibration capacitor when the apparatus resets and controls the switched capacitor array so as to adjust the capacitance of the VCO to generally maintain phase and frequency lock.

20 Claims, 2 Drawing Sheets

OTHER PUBLICATIONS

"A 2.5-Gb/s Multi-Rate 0.25-m CMOS Clock and Data Recovery Circuit Utilizing a Hybrid Analog/Digital Loop Filter and All-Digital Referenceless Frequency Acquisition," IEEE Journal of Solid-State Circuits, vol. 41, No. 12, Dec. 2006, pp. 2930-2944 (Michael H. Perrott, Yunteng Huang, Rex T. Baird, Bruno W. Garlepp, Douglas Pastorello, Eric T. King, Qicheng Yu, Dan B. Kasha, Philip Steiner, Ligang Zhang, Jerrell Hein, and Bruce Del Signore).

PCT Search Report mailed Aug. 9, 2011.

* cited by examiner

US 8,154,350 B2

PLL WITH CONTINUOUS AND BANG-BANG FEEDBACK CONTROLS

TECHNICAL FIELD

The invention relates generally to a phase locked loop (PLL) and, more particularly, to a PLL having continuous and digital "bang-bang" feedback controls.

BACKGROUND

PLLs are commonly used in synthesizer subsystems. Turning to FIG. 1 of the drawings, an example of a conventional PLL 100 using continuous calibration can be seen. The PLL 100 is generally comprised of a phase/frequency detector (PFD) 202, charge pump 204, loop filter 206, a dual gain voltage controlled oscillator (VCO) 102, divider 220, amplifier 218, and calibration capacitor CCT. In this configuration, there are two separate analog loops, a low bandwidth loop (formed with the error amplifier 218 and VCO 102) and a high bandwidth loop (formed with divider 220 and VCO 102) so that the low bandwidth loop can apply a coarse tuning voltage VC to the VCO 102 and that the high bandwidth loop can apply a fine tuning voltage VF to VCO 102.

In operation, the high bandwidth loop operates as a conventional single path PLL, providing a low tuning gain characteristic for VCO 102 with the application of the fine tuning voltage VF to VCO 102, whereas the low bandwidth loop allows for the provision of a wide frequency tuning range characteristic. In particular with the low bandwidth loop, transconductance error amplifier 218 amplifies the difference between the fine tuning voltage VF (output from loop filter 206) and reference voltage REF, and this difference is applied as a current to capacitor CCT so as to generate coarse tuning voltage VC, which is applied to VCO 102 for the wide tuning bandwidth of VCO 102. The low frequency loop will coarsely tune the wideband VCO to within a range where the high bandwidth loop becomes operational. This is accomplished by providing continuous (but low frequency) correction to the VCO 102. Because the low bandwidth loop tracks low frequency changes in the input signal, this loop will have little direct influence on the spur level and wide band phase noise performance of the PLL 100.

The high bandwidth loop does not operate until the VCO 102 is tuned to a frequency that falls within the fine frequency input tuning range of VCO 102, where the fine tuning gain of VCO 102 becomes non zero. The high bandwidth loop is generally responsible for setting the generally relevant noise characteristics. In the conventional single loop PLL the tradeoff between tuning range and noise performance is tightly coupled. The use of two loops effectively decouples this trade-off, allowing PLL 100 to offer better performance over other conventional single path PLLs.

A drawback of this configuration, however, is the slow settling time of PLL 100. Generally, the slow settling time can be attributed to the low bandwidth, coarse tuning loop. Another drawback is the size of capacitor CCT, which is often very large in order to suppress the noise of amplifier 218. Due to these drawbacks, there are some systems where PLL 100 is undesirable. Therefore, there is a need for a PLL with improved performance characteristics.

Some other conventional circuits are: Wu et al., "A 4.2 GHz PLL Frequency Synthesizer with an Adaptively Tuned Coarse Loop", *IEEE* 2007 *Custom Intergrated Circuits Conference*, pp. 547-550; Nonis et al., "Modeling, Design and Characterization of a New Low-Jitter Analog Dual Tuning LC-VCO PLL Architecture", *IEEE J. OF Solid-State Circuits*, Vol. 40, No. 6, June 2005, pp. 1303-1309; Perrott et al., "A 2.5-Gb/s Multi-Rate 0.25-µm CMOS Clock and Data Recovery Circuit Utilizing a Hybrid Analog/Digital Loop Filter and All-Digital Referenceless Frequency Acquisition", *IEEE J. OF Solid-State Circuits*, Vol. 41, No. 12, December 2006, pp. 2930-2944; U.S. Pat. No. 6,658,748; U.S. Pat. No. 6,952,124; U.S. Pat. No. 7,015,763; U.S. Pat. No. 7,133,485; U.S. Pat. No. 7,301,407; U.S. Pat. No. 7,385,452; U.S. Pat. Pre-Grant Publ. No. 2002/0008593; U.S. Patent Pre-Grant Publ. No. 2003/0141936; U.S. Patent Pre-Grant Publ. No. 2005/0212609; U.S. Patent Pre-Grant Publ. No. 2005/0212614; U.S. Patent Pre-Grant Publ. No. 2007/0057736; and datasheet for Texas Instruments Incorporated's CDCE421.

SUMMARY

A preferred embodiment of the present invention, accordingly, provides an apparatus. The apparatus comprises a voltage controlled oscillator (VCO) having: a capacitive network that receives a first tuning voltage that is based at least in part on an input signal; and a switched capacitor array that is coupled to the capacitive network; an amplifier that receives the first tuning voltage and a reference voltage, wherein the amplifier amplifies the difference between the reference voltage and the first tuning voltage; a switch that receives the reference voltage and the amplified difference between the reference voltage and the first tuning voltage; a calibration capacitor that receives the output from the switch and generates a second tuning voltage; and a control loop that receives the input signal and the second tuning voltage, wherein the controller loop controls the switch so as to apply the reference voltage to the calibration capacitor when the apparatus resets, and wherein the control loop controls the switched capacitor array so as to adjust the capacitance of the VCO to generally maintain phase and frequency lock.

In accordance with a preferred embodiment of the present invention, the VCO further comprise an inductive network that is coupled to the capacitive network; and a VCO amplifier that is coupled to the capacitive network.

In accordance with a preferred embodiment of the present invention, the control loop further comprises a precision lock detector; a window adjust circuit that is coupled to the precision lock detector; a narrow window circuit that is coupled to the window adjust circuit; a wide window adjust circuit that is coupled to the window adjust circuit; a divider that receives the input signal; a bang-bang controller that is coupled to the window adjust circuit and the divider; and a counter that is coupled to the bang-bang controller and the switched capacitor array.

In accordance with a preferred embodiment of the present invention, the bang-bang controller further comprises a first comparator that having a first input terminal, a second input terminal, and an output terminal, wherein the first input terminal of the first comparator is coupled to the switch, and wherein the second input terminal of the first comparator is coupled to the window adjust circuit; and a second comparator that having a first input terminal, a second input terminal, and an output terminal, wherein the first input terminal of the second comparator is coupled to the switch, and wherein the second input terminal of the second comparator is coupled to the window adjust circuit.

In accordance with a preferred embodiment of the present invention, the bang-bang controller further comprises a first inverter that is coupled to the divider; a first flip-flop that is coupled to the output terminal of the first comparator and to the divider; a second inverter that is coupled between the first flip-flop and the counter; a second flip flop that is coupled to the first flip-flop and the first inverter; a third flip-flop that is coupled to the output terminal of the second comparator and the divider; a fourth flip-flop that is coupled to the third flip-flop and the first inverter; a first logic gate that is coupled to each of the third and fourth flip-flops and to the counter; and a second logic gate that is coupled to each of the first and second flip-flops and to the switch.

In accordance with a preferred embodiment of the present invention, the first, second, third, and fourth flip-flops are D flip-flops.

In accordance with a preferred embodiment of the present invention, the first and second logic gates are OR gates.

In accordance with a preferred embodiment of the present invention, the switch is a multiplexer.

In accordance with a preferred embodiment of the present invention, the switch is a single-pole double-throw switch.

In accordance with a preferred embodiment of the present invention, an apparatus is provided. The apparatus comprises a phase/frequency detector (PFD) that receives an input signal; a charge pump that is coupled to the PFD; a loop filter that is coupled to the charge pump, wherein the loop filter generates a first tuning voltage; an amplifier that receives the first tuning voltage and a reference voltage; a switch having a first input terminal, a second input terminal, and an output terminal, wherein the first input terminal receives the reference voltage, and wherein the second input terminal is coupled to the amplifier; a calibration capacitor that is coupled to the output terminal of the switch, wherein the calibration capacitor generates a second tuning voltage; a VCO having: an inductive network that is coupled to the capacitive network; a capacitive network that is coupled to the inductive network, wherein the capacitive network is coupled to the loop filter and calibration capacitor so as to receive the first and second tuning voltages; a switched capacitor array that is coupled to the inductive network; and a VCO amplifier that is coupled to the inductive network; a divider that is coupled to the VCO and the PFD; and a control loop that receives the input signal and that is coupled to the switch, the calibration capacitor, and the switched capacitor array, wherein the controller loop controls the switch so as to apply the reference voltage to the calibration capacitor when the apparatus resets, and wherein he control loop controls the switched capacitor array so as to adjust the capacitance of the VCO to generally maintain phase and frequency lock.

In accordance with a preferred embodiment of the present invention, an apparatus is provided. The apparatus comprises a PFD that receives an input signal; a charge pump that is coupled to the PFD; a loop filter that is coupled to the charge pump, wherein the loop filter generates a first tuning voltage; an amplifier that receives the first tuning voltage and a reference voltage; a switch having a first input terminal, a second input terminal, and an output terminal, wherein the first input terminal receives the reference voltage, and wherein the second input terminal is coupled to the amplifier; a calibration capacitor that is coupled to the output terminal of the switch, wherein the calibration capacitor generates a second tuning voltage; a VCO having: an inductive network that is coupled to the capacitive network; a capacitive network that is coupled to the inductive network, wherein the capacitive network is coupled to the loop filter and calibration capacitor so as to receive the first and second tuning voltages; a switched capacitor array that is coupled to the inductive network; and a VCO amplifier that is coupled to the inductive network; a first divider that is coupled to the VCO and the PFD; and a control loop having: a precision lock detector that is coupled to the PFD; a first comparator that having a first input terminal, a second input terminal, and an output terminal, wherein the first input terminal of the first comparator is coupled to the switch, and wherein the second input terminal of the first comparator is coupled to the window adjust circuit; a second comparator that having a first input terminal, a second input terminal, and an output terminal, wherein the first input terminal of the second comparator is coupled to the switch, and wherein the second input terminal of the second comparator is coupled to the window adjust circuit; a second divider that receives the input signal; a first inverter that is coupled to the second divider; a first D flip-flop that is coupled to the output terminal of the second comparator and to the divider; a second inverter that is coupled to the D first flip-flop; a second D flip flop that is coupled to the first D flip-flop and the first inverter; a third D flip-flop that is coupled to the output terminal of the third comparator and the divider; a fourth D flip-flop that is coupled to the third D flip-flop and the first inverter; a first OR gate that is coupled to each of the third and fourth D flip-flops; a second OR gate that is coupled to each of the first and second D flip-flops and to the second input terminal of the first comparator; and a counter that is coupled to the second inverter, the second OR gate, and the switched capacitor array.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
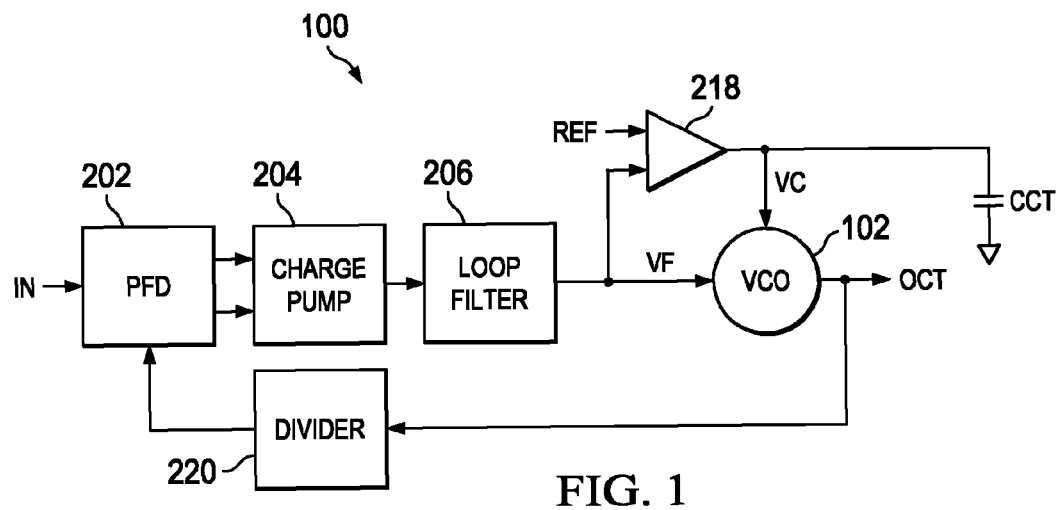
FIG. 1 is a circuit diagram of an example of a conventional PLL employing continuous calibration.

Refer now to the drawings wherein depicted elements are, for the sake of clarity, not necessarily shown to scale and wherein like or similar elements are designated by the same reference numeral through the several views.

Figure 2:
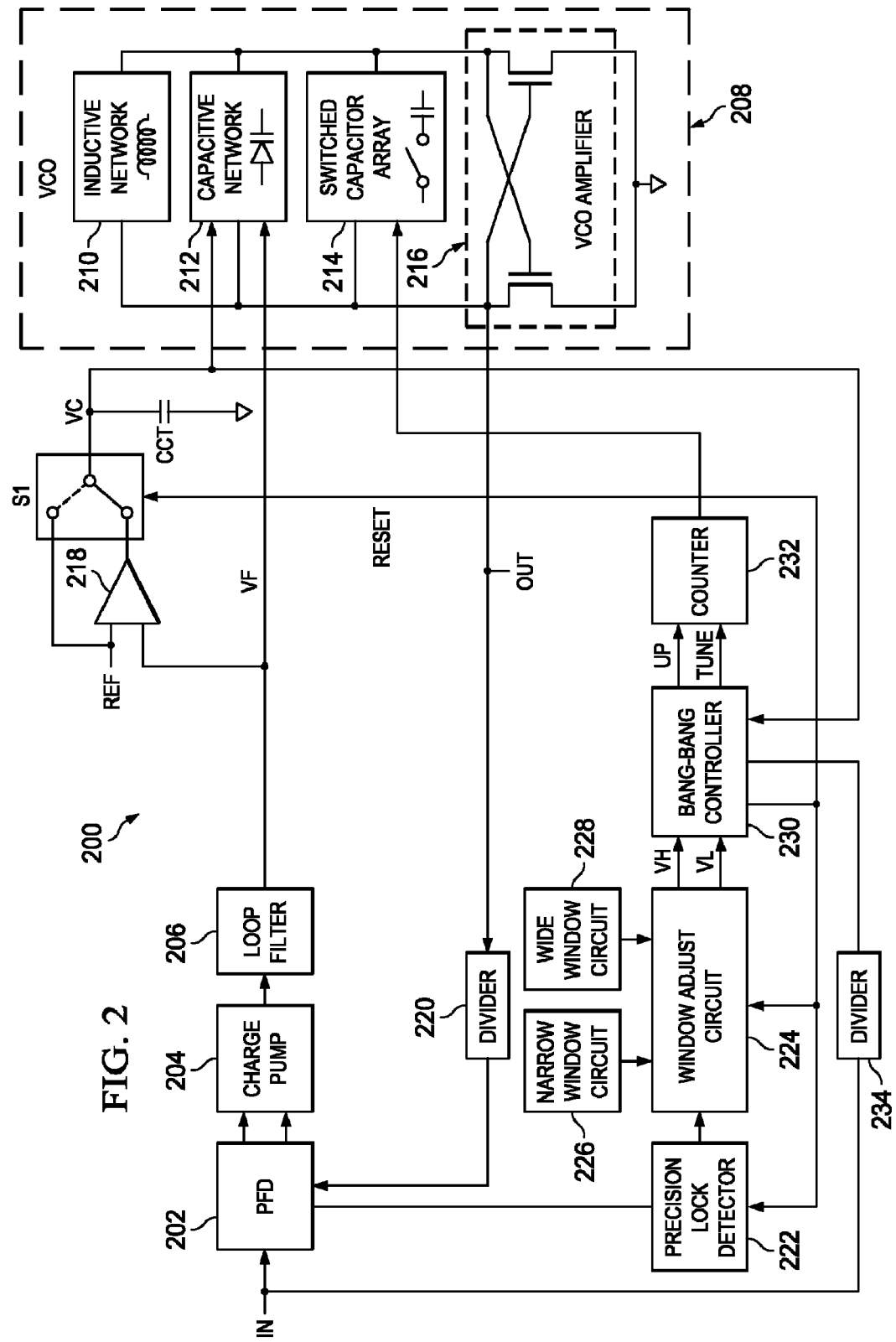
FIG. 2 is a circuit diagram of an example of a PLL with continuous and discrete controls in accordance with a preferred embodiment of the present invention.

Referring to FIG. 2 of the drawings, the reference numeral 200 generally designates a PLL in accordance with a preferred embodiment of the present invention. PLL 200 is generally comprised of PFD 202, charge pump 204, loop filter 206, VCO 208, amplifier 218, switch S1, divider 220, and a control loop. The VCO 208 is generally comprised of an inductive network 210, a capacitive network 212, a switched capacitor array 214, and a VCO amplifier 216. The control loop is generally comprised of precision lock detector 222, narrow window circuit 226, wide window circuit 228, window adjust circuit 224, bang-bang controller 230, counter 232, and divider 234.

Generally, the PFD 202, charge pump 204, loop filter 206, VCO 208, and divider 220 operate as a high bandwidth loop to generate an output signal OUT from input signal similar to the high bandwidth loop of PLL 100. PFD 202 compares a feedback signal from divider 220 to the input signal IN to generate up and down signals for charge pump 204. The output from the charge pump 204 is filtered by loop filter 206 to generate a fine tuning voltage VF for capacitive network 212 of VCO 208, which operates an inductor-capacitor (LC) VCO. Additionally, amplifier 218 and calibration capacitor CCT generally operate as part of a low bandwidth loop similar to the low bandwidth loop of PLL 100.

In operation, though, the control loop of PLL 200 provides additional discrete time controls for VCO 208, which is unavailable with PLL 100. Typically, the control loop measures the coarse voltage VC and input signal IN so as to adjust the switched capacitor array 214 (which is generally comprised of metal-insulator-metal (MIM) capacitors) to generally assist in decreasing the settling time of PLL 200 (compared to PLL 100). This is generally accomplished by setting operational window(s) and making adjustments to the capacitor array when the PLL 200 is outside one of the operational windows.

Turning first to the precision lock detector 222, window adjust circuit 224, narrow window circuit 226, and wide window circuit 228, these circuits generally set an operational window for the PLL 200. Precision lock detector 222 is generally a very high accuracy lock detector that monitors the input phase error, while each of the narrow window circuit 226 and wide window circuit 228 specify a voltage window. For example, the narrow voltage window for the narrow window circuit 226 can be between about 0.8V and about 1.0V, while the wide voltage window for the wide window circuit 228 can be between about 0.5V to about 1.5V. Based on the lock detection from precision lock detector 222 and the voltage window from circuit 226 and/or 228, the window adjust circuit 224 can set threshold voltages VH and VL for the bang-bang controller 230 to correspond to the wide voltage window or the narrow voltage window.

When the PLL 200 is reset (which generally occurs when the coarse tuning voltage VC is outside of the wide voltage window or narrow voltage window, depending on which of the voltage windows is being used), the bang-bang controller 230 asserts a reset signal RESET for the precision lock detector 222, window adjust circuit 224, and switch S1. During reset, the precision lock detector 222 and window adjust circuit 224 reset the threshold voltages VH and VL to generally correspond to the narrow voltage window set by the narrow voltage window circuit 226, and switch S1 (which may be a single-pole double-throw switch or a multiplexer) is set to apply reference voltage REF to calibration capacitor CCT, the capacitive network (which is generally comprised of varactors). The time period for which reset signal RESET is asserted is determined by the period of the sampling clock signal provided by divider 234. During the reset period, capacitor CCT is charged to a coarse voltage VC (which is generally equal to the reference voltage VREF). The voltage VREF is intended to be centered within the window set by threshold voltages VH and VL causing outputs of comparators 312 and 310 to be "0". Once the coarse voltage VC is re-centered, the next rising edge of the sampling clock will end the reset event (de-asserting the reset signal RESET), causing the bang-bang controller 230 to set switch S1 to apply the output of amplifier 218 to capacitor CCT to re-enabling the low bandwidth loop. A reset event (where the reset signal RESET is asserted) will also cause the bang-bang controller 230 to provide an up signal UP and a positive pulse on tune signal TUNE to clock counter 232, which controls the switched capacitor array 214. The logic level of the up signal UP determines whether the counter increments or decrements and whether the frequency of VCO 208 increases or decreases. If the reset event was caused by the coarse voltage VC rising above threshold voltage VH, then up signal UP becomes logic high or "1" and the digital tuning frequency of VCO 208 is increased. If the reset event is caused by the coarse VC dropping below threshold voltage VL, then up signal UP becomes logic low or "0" and the digital tuning frequency word is decreased. So long as the coarse voltage VC is between threshold voltage VL and VH, there are no reset events, no positive edges on tune signal TUNE, or any adjustment of counter 232.

At the end of the reset event, the low bandwidth loop is again operational but with a new digital tuning word applied to the VCO 208. The low bandwidth loop will attempt to adjust coarse voltage VC to acquire phase lock with the new digital tuning word. If coarse voltage VC again crosses threshold voltage VH or VL another reset event will occur and the digital tuning word will be adjusted accordingly. This process will repeat until the low bandwidth loop acquires phase lock with coarse voltage VC settled to a voltage between threshold voltages VL and VH using the narrow window settings from narrow window circuit 226. After the precision lock detector 222 senses phase lock has been attained, the window adjust circuit 224 adjusts the threshold voltages VL and VH to correspond to the wide voltage window from wide window circuit 228.

A reason for having two voltage windows is that it is often desirable to generally prevent the control loop from continuing to adjust (i.e., over a specified frequency or temperature range) once initial digital lock is achieved to avoid perturbation of the PLL 200 and resettling in the continuous (low bandwidth and high bandwidth) loops. This situation could occur if the coarse tuning voltage VC should settle on the edge of the narrow voltage window during initial lock. Under this condition it may take only a small amount of noise or temperature drift to trigger the band-band control loop. This condition can be generally avoided by adding hysteresis through the inclusion and use of the wide voltage window.

Figure 3:
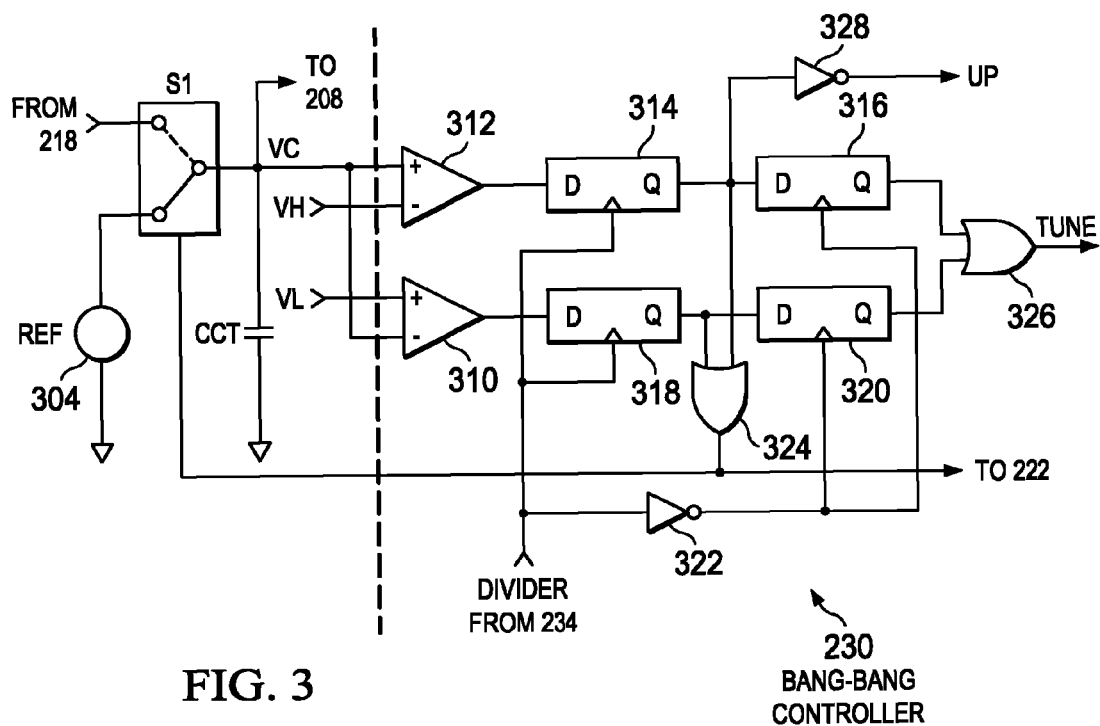
FIG. 3 is a circuit diagram of a more detailed example of the bang-bang controller of FIG. 2.

Turning to FIG. 3, an example of the bang-bang controller 230 can be seen in more detail. Typically, threshold voltages VH and VL (which generally correspond to the narrow voltage window or the wide voltage window) are applied to the negative input terminal of comparator 312 and the positive input terminal of 310, respectively, while the coarse tuning voltage VC is applied to the positive and negative input terminals of comparators 312 and 310. The output of comparators 312 and 310 are latched by D flip-flops 314, 318, 316, and 320. It should be noted that flip-flops 314 and 318 are triggered by the rising edge of the sampling clock from divider 234, while flip-flops 316 and 320 are triggered by the falling edge of the sampling clock from divider 234 due to the inverter 322 making available (half sampling period) delayed versions of the output signals from comparators 310 and 312 for generation of the reset signal RESET and up signal UP as well as the tune signal TUNE pulse for the counter 232 clock input.

When the tuning voltage VC rises above threshold voltage VH, the comparator 312 outputs a "1". This output is latched by D flip-flops 314 and 316 at the rising and falling edges of the sampling clock from divider 234, respectively. Alternatively, if the coarse tuning voltage VC falls below threshold voltage VL, comparator 310 outputs a "1", which is latched by D flip-flop 318 and 320. Based on a "1" from comparator 312 or 314, OR gate 324 outputs a logic high signal or "1", which corresponds to an assertion of the reset signal RESET and a need to increment or decrement counter 232 and switched capacitor array 214 (so as to increase or decrease the frequency of VCO 208). The decision to increment or decrement is based on the output of flip-flop 314 (a delayed sample of comparator 312), where a logic high output indicates that the threshold voltage VH has been crossed and that the frequency of VCO 208 is too low. This indication is passed through inverter 328 to create signal up signal UP which is applied to the UP/Down control (not shown) of counter 232. Counter 232 also uses a positive going clock edge for up/down adjustment to take place. This is provided by the output of OR gate 326, corresponding to the tune pulse signal TUNE. A rising edge on tuning signal TUNE generally occurs once during any sampling period and if coarse voltage VC rises above threshold voltage VH or fall below threshold voltage VL. Furthermore, the half sampling period delay introduced by flip-flops 316 and 320 enables proper timing of the tuning signal TUNE clock edge relative to up signal UP (the counter up/down control) in order to generally ensure reliable operation of the counter 232.

It should noted that reliable operation of the band-bang controller 230 depends on the robustness of the precision lock detector 222, which in turn relies on having low DC offset in the PFD 202 and charge pump 204. In the conventional single loop PLL, the charge pump output voltage is free to settle at any voltage within the supply rails that results in sub-optimal DC offset performance. On the other hand, incorporating the low bandwidth loop into a PLL 200 will settle with charge pump voltage or fine tuning voltage VF so that it is generally equal to reference voltage REF (which is typically placed at mid supply voltage) due to the high gain in amplifier 218. This is an advantageous condition as it improves matching in the up/down current sources within the charge pump 204 that are responsible for the offset problem. This, in turn, allows for the design of a higher precision lock detector (i.e., lock detector 222) than is possible using the single loop architecture. This benefit of the low bandwidth loop has been leveraged in implementing the bang-bang controller algorithm of PLL 200.

As a result of the configuration of PLL 200, several other advantages over conventional PLLs can be realized. The total analog tuning range of VCO 208 can be reduced though the use of digitally controlled metal-insulator-metal or MIM capacitors within the switched capacitor array 214, and there is reduction in the fine and coarse tuning gains for VCO 208. Additionally, phase noise of VCO 208 can be improved by adjusting the ratio of non-linear tuning capacitors (e.g., varactors) to linear tuning capacitor (e.g., MIM capacitors). There is also a reduction of reference spurs and harmonics as well as the ability to reduce the VCO current for a given phase noise and reduce current elsewhere within PLL 200 where current constrains the noise performance. There is also a decrease sensitivity to parasitics, and the settling time is reduced over PLL 100.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
    a voltage controlled oscillator (VCO) having:
        a capacitive network that receives a first tuning voltage that is based at least in part on an input signal; and
        a switched capacitor array that is coupled to the capacitive network;
    an amplifier that receives the first tuning voltage and a reference voltage, wherein the amplifier amplifies the difference between the reference voltage and the first tuning voltage;
    a switch that receives the reference voltage and the amplified difference between the reference voltage and the first tuning voltage;
    a calibration capacitor that receives the output from the switch and generates a second tuning voltage; and
    a control loop that receives the input signal and the second tuning voltage, wherein the control loop controls the switch so as to apply the reference voltage to the calibration capacitor when the apparatus resets, and wherein the control loop controls the switched capacitor array so as to adjust the capacitance of the VCO to generally maintain phase and frequency lock.

2. The apparatus of claim 1, wherein the VCO further comprises:
    an inductive network that is coupled to the capacitive network; and
    a VCO amplifier that is coupled to the capacitive network.

3. The apparatus of claim 1, wherein the control loop further comprises:
    a precision lock detector;
    a window adjust circuit that is coupled to the precision lock detector;
    a narrow window circuit that is coupled to the window adjust circuit;
    a wide window adjust circuit that is coupled to the window adjust circuit;
    a divider that receives the input signal;
    a bang-bang controller that is coupled to the window adjust circuit and the divider; and
    a counter that is coupled to the bang-bang controller and the switched capacitor array.

4. The apparatus of claim 3, wherein the bang-bang controller further comprises:
    a first comparator that having a first input terminal, a second input terminal, and an output terminal, wherein the first input terminal of the first comparator is coupled to the switch, and wherein the second input terminal of the first comparator is coupled to the window adjust circuit; and
    a second comparator that having a first input terminal, a second input terminal, and an output terminal, wherein the first input terminal of the second comparator is coupled to the switch, and wherein the second input terminal of the second comparator is coupled to the window adjust circuit.

5. The apparatus of claim 4, wherein the bang-bang controller further comprises:
    a first inverter that is coupled to the divider;
    a first flip-flop that is coupled to the output terminal of the first comparator and to the divider;
    a second inverter that is coupled between the first flip-flop and the counter;
    a second flip flop that is coupled to the first flip-flop and the first inverter;

a third flip-flop that is coupled to the output terminal of the second comparator and the divider;

a fourth flip-flop that is coupled to the third flip-flop and the first inverter;

a first logic gate that is coupled to each of the third and fourth flip-flops and to the counter; and a second logic gate that is coupled to each of the first and second flip-flops and to the switch.

6. The apparatus of claim 5, wherein the first, second, third, and fourth flip-flops are D flip-flops.

7. The apparatus of claim 5, wherein the first and second logic gates are OR gates.

8. The apparatus of claim 1, wherein the switch is a multiplexer.

9. The apparatus of claim 1, wherein the switch is a single-pole double-throw switch.

10. An apparatus comprising:
a phase/frequency detector (PFD) that receives an input signal;
a charge pump that is coupled to the PFD;
a loop filter that is coupled to the charge pump, wherein the loop filter generates a first tuning voltage;
an amplifier that receives the first tuning voltage and a reference voltage;
a switch having a first input terminal, a second input terminal, and an output terminal, wherein the first input terminal receives the reference voltage, and wherein the second input terminal is coupled to the amplifier;
a calibration capacitor that is coupled to the output terminal of the switch, wherein the calibration capacitor generates a second tuning voltage;
a VCO having:
an inductive network that is coupled to the capacitive network;
a capacitive network that is coupled to the inductive network, wherein the capacitive network is coupled to the loop filter and calibration capacitor so as to receive the first and second tuning voltages;
a switched capacitor array that is coupled to the inductive network; and
a VCO amplifier that is coupled to the inductive network;
a divider that is coupled to the VCO and the PFD; and
a control loop that receives the input signal and that is coupled to the switch, the calibration capacitor, and the switched capacitor array, wherein the control loop controls the switch so as to apply the reference voltage to the calibration capacitor when the apparatus resets, and wherein the control loop controls the switched capacitor array so as to adjust the capacitance of the VCO to generally maintain phase and frequency lock.

11. The apparatus of claim 10, wherein the divider is first divider, and wherein the control loop further comprises:
a precision lock detector that is coupled to the PFD;
a window adjust circuit that is coupled to the precision lock detector;
a narrow window circuit that is coupled to the window adjust circuit;
a wide window adjust circuit that is coupled to the window adjust circuit;
a second divider that receives the input signal;
a bang-bang controller that is coupled to the window adjust circuit and the second divider; and
a counter that is coupled to the bang-bang controller and the switched capacitor array.

12. The apparatus of claim 11, wherein the bang-bang controller further comprises:

a first comparator having a first input terminal, a second input terminal, and an output terminal, wherein the first input terminal of the first comparator is coupled to the switch, and wherein the second input terminal of the first comparator is coupled to the window adjust circuit; and a second comparator having a first input terminal, a second input terminal, and an output terminal, wherein the first input terminal of the second comparator is coupled to the switch, and wherein the second input terminal of the second comparator is coupled to the window adjust circuit.

13. The apparatus of claim 12, wherein the bang-bang controller further comprises:
a first inverter that is coupled to the divider;
a first flip-flop that is coupled to the output terminal of the first comparator and to the divider;
a second inverter that is coupled between the first flip-flop and the counter;
a second flip flop that is coupled to the first flip-flop and the first inverter;
a third flip-flop that is coupled to the output terminal of the second comparator and the divider;
a fourth flip-flop that is coupled to the third flip-flop and the first inverter;
a first logic gate that is coupled to each of the third and fourth flip-flops and to the counter; and
a second logic gate that is coupled to each of the first and second flip-flops and to the switch.

14. The apparatus of claim 13, wherein the first, second, third, and fourth flip-flops are D flip-flops.

15. The apparatus of claim 13, wherein the first and second logic gates are OR gates.

16. The apparatus of claim 10, wherein the switch is a multiplexer.

17. The apparatus of claim 10, wherein the switch is a single-pole double-throw switch.

18. An apparatus comprising:
a PFD that receives an input signal;
a charge pump that is coupled to the PFD;
a loop filter that is coupled to the charge pump, wherein the loop filter generates a first tuning voltage;
an amplifier that receives the first tuning voltage and a reference voltage;
a switch having a first input terminal, a second input terminal, and an output terminal, wherein the first input terminal receives the reference voltage, and wherein the second input terminal is coupled to the amplifier;
a calibration capacitor that is coupled to the output terminal of the switch, wherein the calibration capacitor generates a second tuning voltage;
a VCO having:
an inductive network that is coupled to the capacitive network;
a capacitive network that is coupled to the inductive network, wherein the capacitive network is coupled to the loop filter and calibration capacitor so as to receive the first and second tuning voltages;
a switched capacitor array that is coupled to the inductive network; and
a VCO amplifier that is coupled to the inductive network;
a first divider that is coupled to the VCO and the PFD; and
a control loop having:
a precision lock detector that is coupled to the PFD;
a first comparator that having a first input terminal, a second input terminal, and an output terminal, wherein the first input terminal of the first comparator is coupled to the switch, and wherein the second input terminal of the first comparator is coupled to a window adjust circuit;

a second comparator that having a first input terminal, a second input terminal, and an output terminal, wherein the first input terminal of the second comparator is coupled to the switch, and wherein the second input terminal of the second comparator is coupled to the window adjust circuit;

a second divider that receives the input signal;

a first inverter that is coupled to the second divider;

a first D flip-flop that is coupled to the output terminal of the second comparator and to the divider;

a second inverter that is coupled to the first D flip-flop;

a second D flip flop that is coupled to the first D flip-flop and the first inverter;

a third D flip-flop that is coupled to the output terminal of the second comparator and the divider;

a fourth D flip-flop that is coupled to the third D flip-flop and the first inverter;

a first OR gate that is coupled to each of the third and fourth D flip-flops;

a second OR gate that is coupled to each of the first and second D flip-flops and to the second input terminal of the first comparator; and a counter that is coupled to the second inverter, the second OR gate, and the switched capacitor array.

19. The apparatus of claim 18, wherein the switch is a multiplexer.

20. The apparatus of claim 18, wherein the switch is a single-pole double-throw switch.

* * * * *